(12) United States Patent
Rofougaran

(10) Patent No.: US 7,982,555 B2
(45) Date of Patent: Jul. 19, 2011

(54) METHOD AND SYSTEM FOR PROCESSING SIGNALS VIA POWER SPLITTERS EMBEDDED IN AN INTEGRATED CIRCUIT PACKAGE

(75) Inventor: Ahmadreza Rofougaran, Newport Coast, CA (US)

(73) Assignee: Broadcom Corporation, Irvine, CA (US)

( * ) Notice: Subject to any disclaimer, the term of this patent is extended or adjusted under 35 U.S.C. 154(b) by 435 days.

(21) Appl. No.: 12/057,666

(22) Filed: Mar. 28, 2008

(65) Prior Publication Data

US 2009/0243753 A1    Oct. 1, 2009

(51) Int. Cl.
*H01P 3/08* (2006.01)
*H01P 5/12* (2006.01)

(52) U.S. Cl. .................... 333/128; 333/126; 333/134

(58) Field of Classification Search ............... 333/127, 333/128, 130, 134
See application file for complete search history.

(56) References Cited

U.S. PATENT DOCUMENTS

| | | | |
|---|---|---|---|
| 4,704,625 A * | 11/1987 | Lee .................... | 257/296 |
| 5,629,241 A * | 5/1997 | Matloubian et al. ...... | 438/125 |
| 5,634,208 A * | 5/1997 | Nishikawa et al. ....... | 455/327 |
| 5,914,873 A | 6/1999 | Blish, II | |
| 6,462,976 B1 | 10/2002 | Olejniczak et al. | |
| 6,525,623 B2 * | 2/2003 | Sridharan et al. ........... | 333/128 |
| 6,570,442 B2 | 5/2003 | Nakai et al. | |
| 6,590,468 B2 | 7/2003 | du Toit et al. | |
| 6,848,178 B2 | 2/2005 | Kondo et al. | |
| 6,967,544 B2 * | 11/2005 | Ji ..................... | 333/136 |
| 7,045,440 B2 | 5/2006 | Huff et al. | |
| 7,084,715 B2 | 8/2006 | Al-Taei et al. | |
| 7,138,884 B2 | 11/2006 | Cheung et al. | |
| 7,149,496 B2 | 12/2006 | Horiuchi et al. | |
| 7,183,633 B2 | 2/2007 | Daneman et al. | |
| 7,289,008 B2 | 10/2007 | Kuroki et al. | |
| 7,336,232 B1 | 2/2008 | Lee et al. | |
| 7,348,842 B2 | 3/2008 | Ichitsubo et al. | |
| 7,427,977 B2 | 9/2008 | Park et al. | |
| 7,515,879 B2 | 4/2009 | Okabe et al. | |
| 7,518,248 B2 | 4/2009 | Li et al. | |
| 2002/0039026 A1 | 4/2002 | Stroth et al. | |
| 2002/0180063 A1 | 12/2002 | Iwaki et al. | |
| 2004/0222506 A1 | 11/2004 | Wei et al. | |
| 2005/0023656 A1 | 2/2005 | Leedy | |
| 2005/0161753 A1 * | 7/2005 | Huff et al. ............... | 257/431 |
| 2005/0212642 A1 | 9/2005 | Pleskach et al. | |
| 2005/0270135 A1 | 12/2005 | Chua et al. | |
| 2006/0091958 A1 | 5/2006 | Bhatti et al. | |
| 2006/0152911 A1 | 7/2006 | Humbert et al. | |
| 2007/0062027 A1 | 3/2007 | Ripamonti et al. | |
| 2009/0127674 A1 | 5/2009 | Suzuki | |
| 2009/0189064 A1 | 7/2009 | Miller et al. | |
| 2009/0243535 A1 | 10/2009 | Erdmann et al. | |

\* cited by examiner

*Primary Examiner* — Robert Pascal
*Assistant Examiner* — Kimberly E Glenn
(74) *Attorney, Agent, or Firm* — McAndrews, Held & Malloy, Ltd.

(57) ABSTRACT

Methods and systems for processing signals via power splitters embedded in an integrated circuit package may include generating via a power splitter, one or more RF signals proportional to one or more received RF signals. The power splitter may be integrated in a multi-layer package. The generated RF signals may be processed via an integrated circuit, which may be electrically coupled to the multi-layer package. The power splitters may include quarter wavelength transmission lines. The transmission lines may include a microstrip structure or a coplanar structure. The power splitters may be bonded to one or more capacitors in the integrated circuit. The capacitors may include CMOS devices in the integrated circuit. The power splitters may include lumped devices which may include surface mount devices coupled to the multi-layer package or devices within the integrated circuit, which may be flip-chip bonded to the multi-layer package.

20 Claims, 6 Drawing Sheets

US 7,982,555 B2

METHOD AND SYSTEM FOR PROCESSING SIGNALS VIA POWER SPLITTERS EMBEDDED IN AN INTEGRATED CIRCUIT PACKAGE

CROSS-REFERENCE TO RELATED APPLICATIONS/INCORPORATION BY REFERENCE

[Not Applicable]

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to wireless communication. More specifically, certain embodiments of the invention relate to a method and system for processing signals via power splitters embedded in an integrated circuit package.

BACKGROUND OF THE INVENTION

Mobile communications have changed the way people communicate and mobile phones have been transformed from a luxury item to an essential part of every day life. The use of mobile phones is today dictated by social situations, rather than hampered by location or technology. While voice connections fulfill the basic need to communicate, and mobile voice connections continue to filter even further into the fabric of every day life, the mobile Internet is the next step in the mobile communication revolution. The mobile Internet is poised to become a common source of everyday information, and easy, versatile mobile access to this data will be taken for granted.

As the number of electronic devices enabled for wireline and/or mobile communications continues to increase, significant efforts exist with regard to making such devices more power efficient. For example, a large percentage of communications devices are mobile wireless devices and thus often operate on battery power. Additionally, transmit and/or receive circuitry within such mobile wireless devices often account for a significant portion of the power consumed within these devices. Moreover, in some conventional communication systems, transmitters and/or receivers are often power inefficient in comparison to other blocks of the portable communication devices. Accordingly, these transmitters and/or receivers have a significant impact on battery life for these mobile wireless devices.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for processing signals via power splitters embedded in an integrated circuit package, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for processing signals via power splitters embedded in an integrated circuit package. Exemplary aspects of the invention may comprise generating via a power splitter, one or more RF signals whose power may be proportional to one or more received RF signals. The power splitter may be integrated in a multi-layer package and the integrated circuit (IC) may be bonded to the multilayer package. The integrated circuit may be flip-chip bonded to the multi-layer package. The generated RF signals may be processed via one or more circuits within an integrated circuit, which may be electrically coupled to the multi-layer package. The power splitters may comprise quarter wavelength transmission lines or any integer multiple of quarter wavelength. The transmission lines may comprise a microstrip structure or a coplanar structure. The power splitters may be electrically coupled to one or more capacitors in the integrated circuit. The capacitors may comprise CMOS devices in the integrated circuit. The power splitters may comprise lumped devices which may comprise surface mount devices coupled to the multi-layer package. The lumped devices may comprise devices integrated in the integrated circuit.

Figure 1:
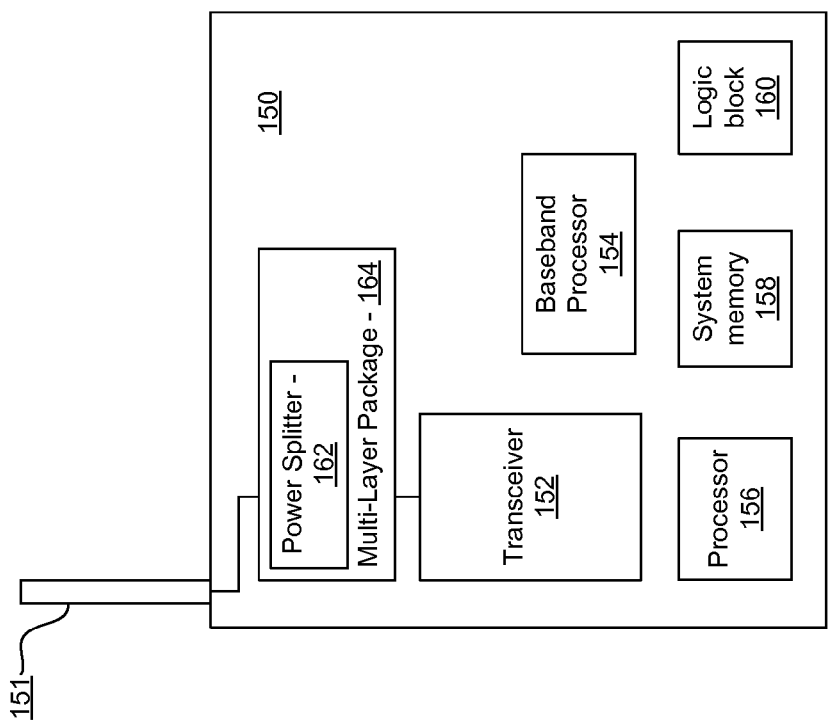
FIG. 1 is a block diagram of an exemplary wireless system, which may be utilized in accordance with an embodiment of the invention.

FIG. 1 is a block diagram of an exemplary wireless system, which may be utilized in accordance with an embodiment of the invention. Referring to FIG. 1, the wireless system 150 may comprise an antenna 151, a transceiver 152, a baseband processor 154, a processor 156, a system memory 158, a logic block 160, a power splitter 162, and a multi-layer package 164. The antenna 151 may be used for reception and/or transmission of RF signals.

The transceiver 152 may comprise suitable logic, circuitry, and/or code that may be enabled to modulate and upconvert baseband signals to RF signals for transmission by one or more antennas, which may be represented generically by the antenna 151. The transceiver 152 may also be enabled to downconvert and demodulate received RF signals to baseband signals. The RF signals may be received by one or more antennas, which may be represented generically by the antenna 151. Different wireless systems may use different antennas for transmission and reception. The transceiver 152 may be enabled to execute other functions, for example, filtering, coupling, and/or amplifying the baseband and/or RF signals. Although a single transceiver 152 is shown, the invention is not so limited. Accordingly, the transceiver 152 may be implemented as a separate transmitter and a separate receiver. In addition, there may be a plurality transceivers, transmitters and/or receivers. In this regard, the plurality of transceivers, transmitters and/or receivers may enable the wireless system 150 to handle a plurality of wireless protocols and/or standards including cellular, WLAN and PAN.

The power splitter 162 may comprise suitable circuitry, logic, and/or code that may enable dividing an RF signal into two RF signals of lower power. The power splitter 162 may be coupled between the transceiver 152 and the antenna 151. In another embodiment of the invention, the power splitter 162 may act as a power combiner by applying two input RF signals to the output of the power splitter 162 and receiving an output signal at the input of the power splitter 162 that may correspond to an RF signal. In this regard, the power may be a sum of the two input RF signals. The power splitter 162 may be integrated within the multi-layer package 164.

The multi-layer package 164 may comprise multiple layers of insulator and conductive material for integrating multiple devices within the package. The multi-layer package 164 may enable the coupling of multiple devices to an integrated circuit. In an embodiment of the invention, integrated circuits may be flip-chip bonded to the multi-layer package 164. In this manner, one or more circuits and/or devices integrated into the multi-layer package 164 may be coupled to devices within an integrated circuit with low parasitic impedances.

In an embodiment of the invention, the power splitter 162 may be coupled between the transceiver 152 and the antenna 151. The power splitter 162 may be integrated in a multi-layer package comprising metal layers deposited on the top, bottom and/or embedded within the multi-layer package. The power splitter 162 may enable the coupling of a portion of an RF signal from the transceiver 152 to the antenna 151. Other exemplary applications of directional couplers may comprise power combining.

The baseband processor 154 may comprise suitable logic, circuitry, and/or code that may be enabled to process baseband signals for transmission via the transceiver 152 and/or the baseband signals received from the transceiver 152. The processor 156 may be any suitable processor or controller such as a CPU or DSP, or any type of integrated circuit processor. The processor 156 may comprise suitable logic, circuitry, and/or code that may be enabled to control the operations of the transceiver 152 and/or the baseband processor 154. For example, the processor 156 may be utilized to update and/or modify programmable parameters and/or values in a plurality of components, devices, and/or processing elements in the transceiver 152 and/or the baseband processor 154. At least a portion of the programmable parameters may be stored in the system memory 158.

The system memory 158 may comprise suitable logic, circuitry, and/or code that may be enabled to store a plurality of control and/or data information, including parameters needed to calculate frequencies and/or gain, and/or the frequency value and/or gain value. The system memory 158 may store at least a portion of the programmable parameters that may be manipulated by the processor 156.

The logic block 160 may comprise suitable logic, circuitry, and/or code that may enable controlling of various functionalities of the wireless system 150. For example, the logic block 160 may comprise one or more state machines that may generate signals to control the transceiver 152 and/or the baseband processor 154. The logic block 160 may also comprise registers that may hold data for controlling, for example, the transceiver 152 and/or the baseband processor 154. The logic block 160 may also generate and/or store status information that may be read by, for example, the processor 156. Amplifier gains and/or filtering characteristics, for example, may be controlled by the logic block 160.

In operation, control and/or data information, which may comprise the programmable parameters, may be transferred from other portions of the wireless system 150, not shown in FIG. 1, to the processor 156. Similarly, the processor 156 may be enabled to transfer control and/or data information, which may include the programmable parameters, to other portions of the wireless system 150, not shown in FIG. 1, which may be part of the wireless system 150.

The processor 156 may utilize the received control and/or data information, which may comprise the programmable parameters, to determine an operating mode of the transceiver 152. For example, the processor 156 may be utilized to select a specific frequency for a local oscillator, a specific gain for a variable gain amplifier, configure the local oscillator and/or configure the variable gain amplifier for operation in accordance with various embodiments of the invention. Moreover, the specific frequency selected and/or parameters needed to calculate the specific frequency, and/or the specific gain value and/or the parameters, which may be utilized to calculate the specific gain, may be stored in the system memory 158 via the processor 156, for example. The information stored in system memory 158 may be transferred to the transceiver 152 from the system memory 158 via the processor 156.

One or more power splitters 162 may be integrated within an integrated circuit multi-layer package 164 in the wireless device 150, and may enable the splitting of one or more RF signals that may be transmitted and/or received by the antenna 151. The one or more power splitters 162 may comprise discrete devices and/or one or more quarter wavelength transmission lines, as described further with respect to at least FIGS. 2A-2C. Power splitters may be utilized in balanced amplifiers, high-power transmitters, and/or to transmit via multiple antennas, for example. By integrating power splitters in a package flip-chip bonded to an integrated circuit, parasitic impedances may be significantly reduced, and speed may be increased while reducing losses.

Figure 2A:
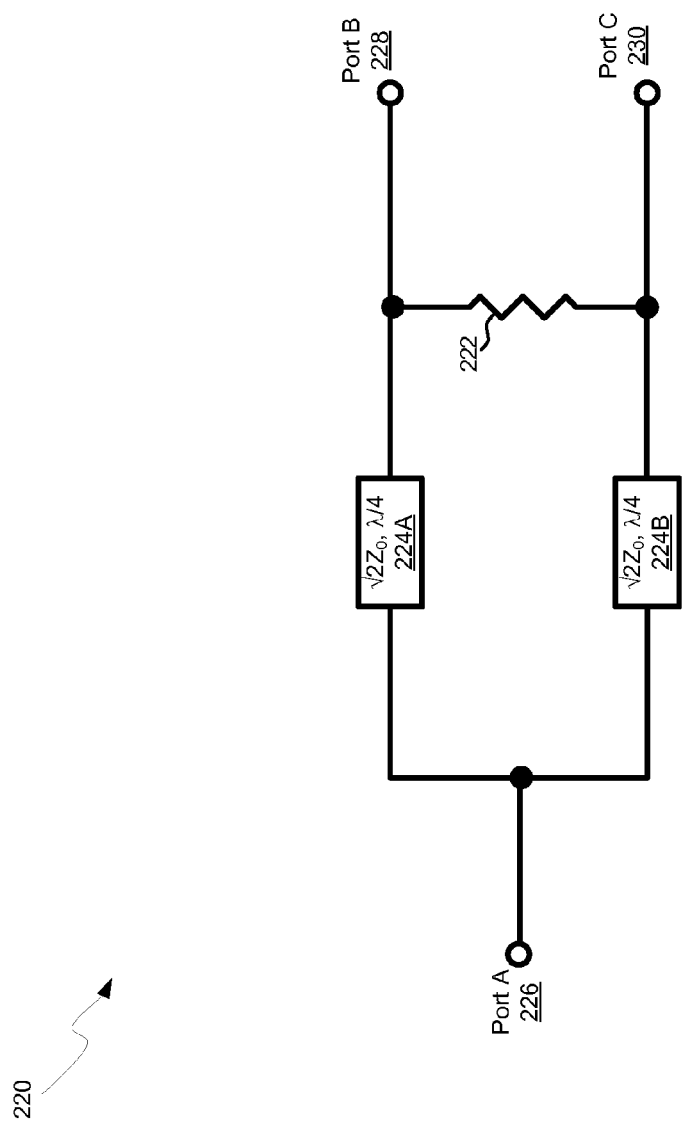
FIG. 2A is a block diagram of a transmission line power splitter, in accordance with an embodiment of the invention.

FIG. 2A is a block diagram of a transmission line power splitter, in accordance with an embodiment of the invention. Referring to FIG. 2A, there is shown a power splitter 220 comprising quarter wavelength transmission lines 224A and 224B, and a resistor 222. There is also shown port A 226, port B 228, and port C 230.

The quarter wavelength transmission lines 224A and 224B may comprise distributed impedance structures for the propagation of RF signals, and with a length that may equal one fourth of the wavelength of the RF signals to be communicated. The quarter wavelength transmission lines 224A and 224B may comprise a characteristic impedance that may be utilized along with the resistor 222 to provide impedance matching between devices coupled to the inputs and the outputs of the power splitter 220. In an exemplary embodiment of the invention, the characteristic impedance at each port of the power splitter 220 may be defined as $Z_o$, and the impedances of the quarter wavelength transmission lines 224A and 224B may be equal to the square root of 2 times $Z_o$. The resistor 222 may be integrated in an IC package, such as the chip 201, described with respect to FIG. 2C, or may comprise a discrete resistor, such as a surface mount device, also described with respect to FIG. 2C.

In operation, an RF signal may be communicated to the port A 226, and two output signals may be generated at the port B 228 and the port C 230, each with substantially similar power levels, as defined by the characteristic impedances of the quarter wavelength transmission lines 224A and 224B and the resistor 222.

Alternatively, two input signals may be communicated to the port B 228 and port C 230, and an output signal may be generated at the port A 226, which may comprise the sum of the two input signals. In this manner, the power splitter 220 may act as a power combiner.

Figure 2B:
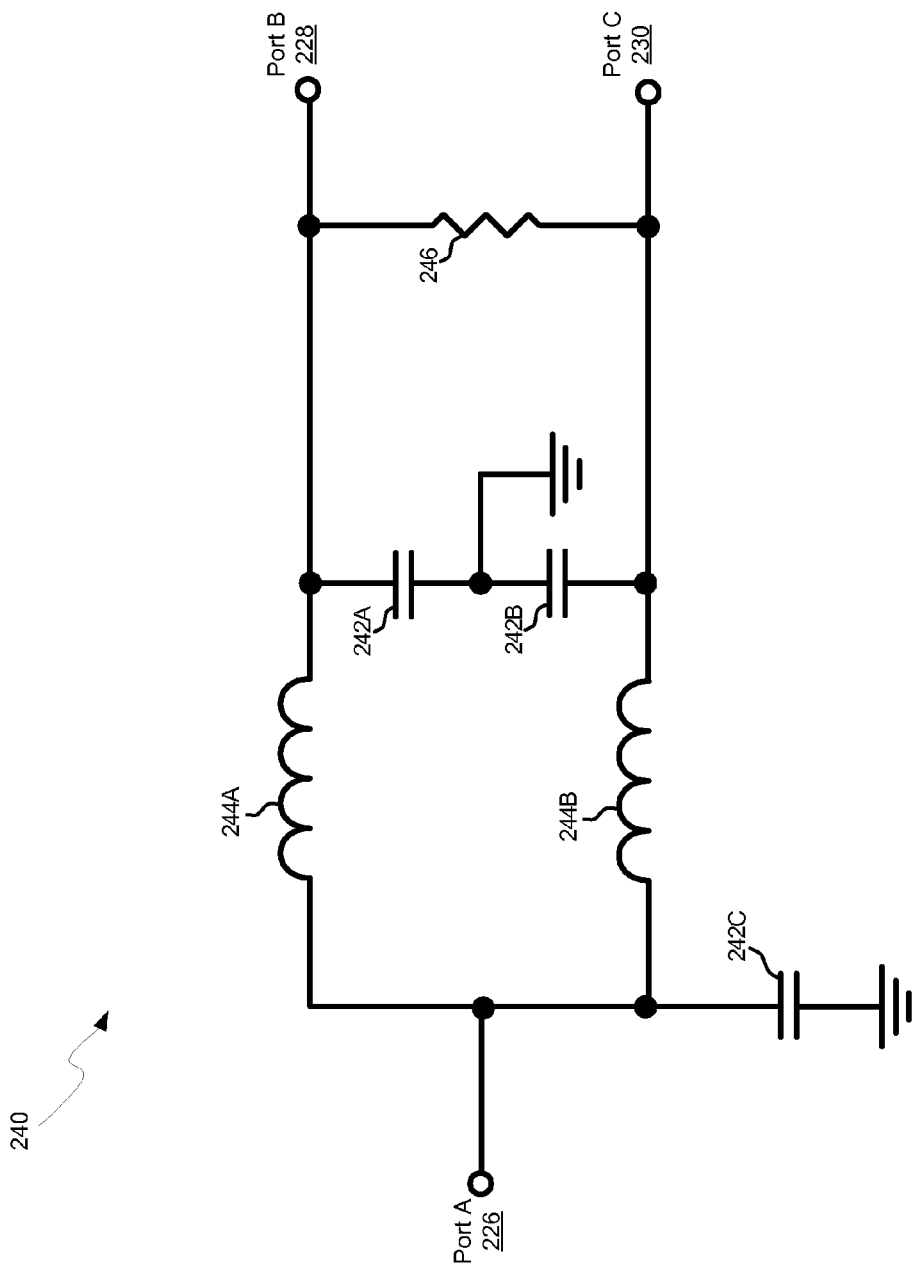
FIG. 2B is a block diagram illustrating an exemplary lumped power splitter, in accordance with an embodiment of the invention.

FIG. 2B is a block diagram illustrating an exemplary lumped power splitter, in accordance with an embodiment of the invention. Referring to FIG. 2B, there is shown a discrete power splitter 240 comprising inductors 244A and 244B, capacitors 242A, 242B, and 242C, and a resistor 246. There is also shown the port A 226, port B 228, and port C 230, which may be as described with respect to FIG. 2A.

Figure 2C:
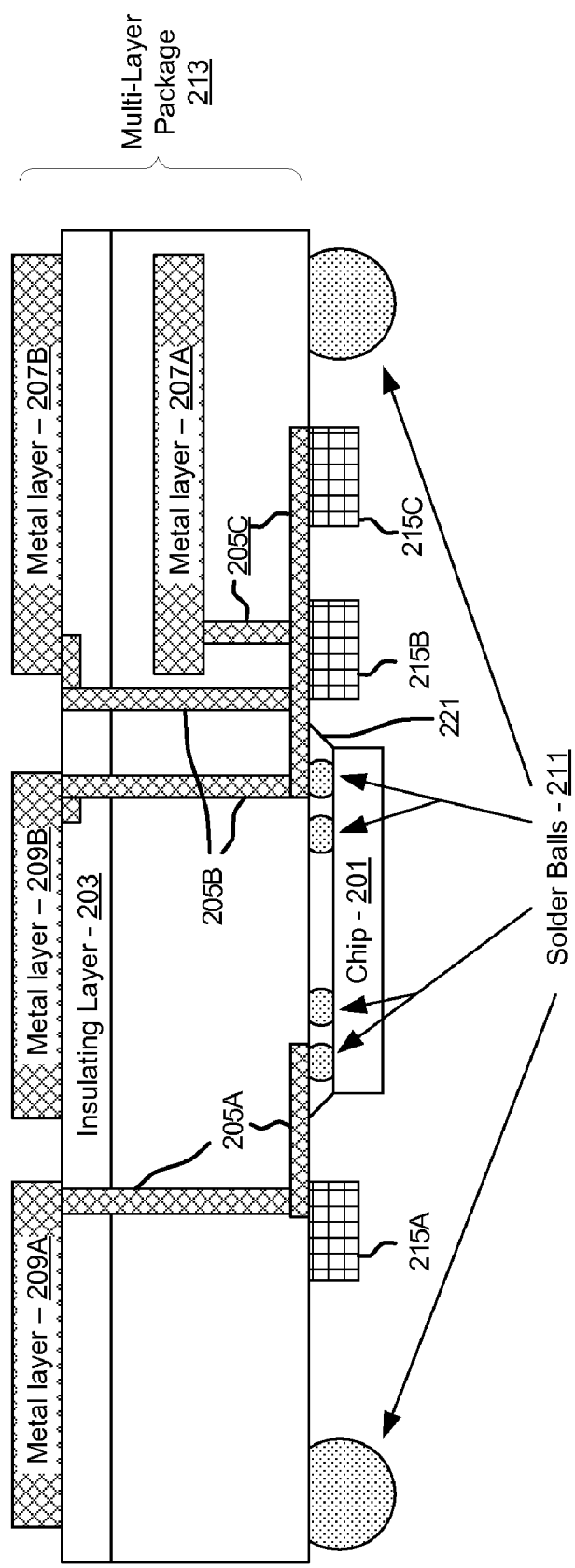
FIG. 2C is a block diagram illustrating a cross-sectional view of a multi-layer package with power splitters, in accordance with an embodiment of the invention.

The capacitors 242A, 242B, and 242C may comprise CMOS capacitors, for example, that may be integrated in an integrated circuit (IC) package, such as the multi-layer package 213, described with respect to at least FIG. 2C. In another embodiment of the invention, the capacitors 242A, 242B, and 242C may comprise devices in an integrated circuit, such as the chip 201, described with respect to FIG. 2C. The inductors 244A and 244B may comprise discrete inductors integrated in an IC package, or as surface mount devices coupled to an IC package, for example. Integrating devices on an IC package is described further with respect to FIG. 2C.

In operation, an RF signal may be communicated to the port A 226, and two output signals may be generated at the port B 228 and the port C 230, each with substantially similar power levels, as defined by the impedances of the capacitors 242A, 242B, and 242C, the inductors 244A and 244B, and the resistor 246.

Alternatively, two input signals may be communicated to the port B 228 and the port C 230, and an output signal may be generated at the port A 226, which may comprise the sum of the two input signals. In this manner, the power splitter 240 may act as a power combiner.

FIG. 2C is a block diagram illustrating a cross-sectional view of a multi-layer package with power splitters, in accordance with an embodiment of the invention. Referring to FIG. 2C, there is shown a chip 201, an insulating layer 203, metal layers 205A, 205B, 205C, 207A, 207B, 209A, and 209B, solder balls 211, a multi-layer package 213, surface mount components 215A, 215B, and 215C, and thermal epoxy 221.

The chip 201, or integrated circuit, may comprise the transceiver 152 described with respect to FIG. 1, or may also comprise any other integrated circuit within the wireless system 150 that may require directional couplers. The chip 201 may be bump-bonded or flip-chip bonded to the multi-layer package 213 utilizing the solder balls 211. In this manner, wire bonds connecting the chip 201 to the multi-layer package 213 may be eliminated, reducing and/or eliminating uncontrollable stray inductances due to wire bonds. In addition, the thermal conductance out of the chip 201 may be greatly improved utilizing the solder balls 211 and the thermal epoxy 221. The thermal epoxy 221 may be electrically insulating but thermally conductive to allow for thermal energy to be conducted out of the chip 201 to the much larger thermal mass of the multilayer package 213.

The metal layers 205A, 205B, 205C, 207A, 207B, 209A, and 209B may comprise deposited metal layers utilized to delineate power splitters and other devices. The metal layers 207A, 207B, 209A, and 209B may be patterned such that they may comprise transmission lines that may be utilized in power splitters for RF signals transmitted and/or received by the antenna 151 and communicated to and/or from the chip 201. The metal layers 209A and 209B may comprise a coplanar transmission line structure and the metal layers 207A and 207B may comprise a microstrip transmission line structure.

In another embodiment of the invention, one or more of the metal layers may comprise ferromagnetic and/or ferrimagnetic layers utilized to define devices such as transformers, inductors, baluns, isolators, circulators, and gyrators. Accordingly, the metal layers 205A, 205B, 205C, 207A, 207B, 209A, and 209B may comprise one or more inductors that may be utilized to provide inductance for the power splitter 240 for example.

The metal layers 205A, 205B, and 205C may provide electrical contact from the transmission line structures and the surface mount devices 215A, 215B, and 215C to the chip 201 via the solder balls 211. The number of metal layers may not be limited to the number of metal layers 205A, 205B, 205C, 207A, 207B, 209A, and 209B shown in FIG. 2. Accordingly, there may be any number of layers embedded within the multi-layer package 213, depending on the number of contacts on the chip 201 coupled to the solder balls 211, and the number of power splitters and other devices fabricated within and/or on the multi-layer package 213.

The solder balls 211 may comprise spherical balls of metal to provide electrical, thermal and physical contact between the chip 201 and the multi-layer package 213. In making the contact with the solder balls 211, the chip may be pressed with enough force to squash the metal spheres somewhat, and may be performed at an elevated temperature to provide suitable electrical resistance and physical bond strength. The thermal epoxy 221 may fill the volume between the solder balls 211 and may provide a high thermal conductance path for heat transfer out of the chip 201. The solder balls 211 may also be utilized to provide electrical, thermal and physical contact between the multi-layer package 213 and a printed circuit board comprising other parts of the wireless system 150, described with respect to FIG. 1.

The surface mount devices 215A, 215B, and 215C may comprise discrete circuit elements such as resistors, capacitors, inductors, and diodes, for example. The surface mount devices 215A, 215B, and 215C may be soldered to the multi-layer package 213 to provide electrical contact.

In operation, the chip 201 may comprise an RF front end, such as the RF transceiver 152, described with respect to FIG. 1, and may be utilized to transmit and receive RF signals. The chip 201 may be electrically coupled to power splitters or other devices fabricated on and/or within the multi-layer package 213, such as transformers, baluns, transmission lines, inductors, capacitors, microstrip filters, coplanar waveguide filters and surface mount devices, for example. Heat from the chip 201 may be conducted to the multi-layer package via the thermal epoxy 221 and the solder balls 211. In an embodiment of the invention, an array of capacitors in the chip 201 may be used in conjunction with power splitters and other devices in and/or on the multi-layer package 213. Similarly, the resistances and capacitances in the power splitters, such as those described with respect to FIGS. 2A and 2B, may be configurable via switches in the chip 201 and/or MEMS switches integrated in the multi-layer package 213. In this manner, power splitter output level may be configured by appropriate impedances in the chip and the multi-layer package 213.

Figure 3:
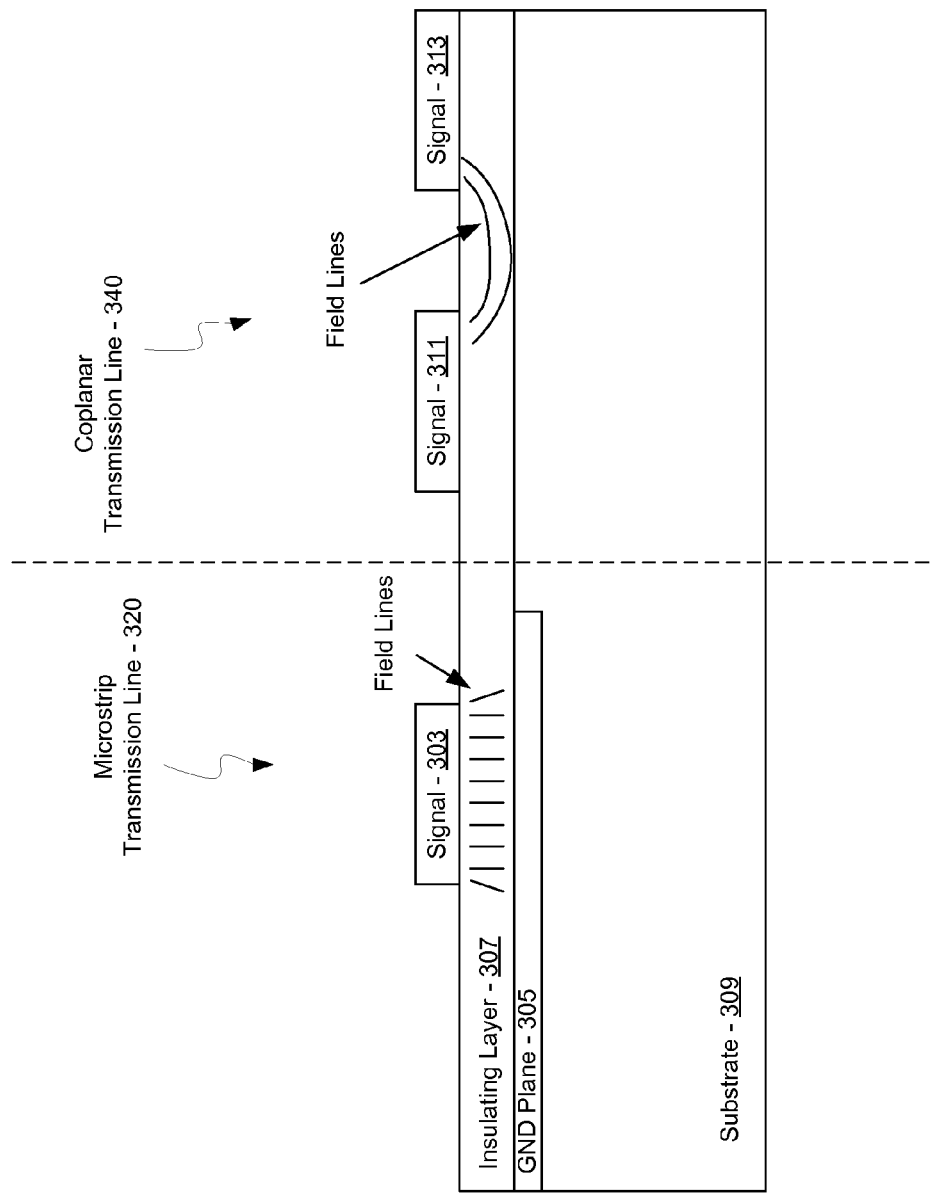
FIG. 3 is a block diagram illustrating a cross-sectional view of coplanar and microstrip transmission lines, in accordance with an embodiment of the invention.

FIG. 3 is a block diagram illustrating a cross-sectional view of coplanar and microstrip transmission lines, in accordance with an embodiment of the invention. Referring to FIG. 3, there is shown a microstrip transmission line 320 and a coplanar transmission line 340. The microstrip transmission line 320 may comprise a signal conductive line 303, a ground plane 305, an insulating layer 307 and a substrate 309. The coplanar transmission line 340 may comprise signal conductive lines 311 and 313, the insulating layer 307, and the substrate 309.

The signal conductive lines 303, 311, and 313 may comprise metal traces deposited in and/or on the insulating layer 307. The length of the signal conductive line 303 may correspond to an integer factor of one fourth of the wavelength of the RF signal to be propagated through the microstrip transmission line 320, and the length of the signal conductive lines 311 and 313 may correspond to an integer factor of one fourth of the wavelength of the RF signal to be propagated through the coplanar transmission line 340. In another embodiment of the invention, the signal conductive lines 303, 311, and 313 may comprise poly-silicon or other conductive material. The separation and the voltage potential between the signal conductive line 303 and the ground plane 305 may determine the electric field generated therein. In addition, the dielectric constant of the insulating layer 307 may also determine the electric field between the signal conductive line 303 and the ground plane 305.

The insulating layer 307 may comprise $SiO_2$ or other insulating material that may provide a high resistance insulating layer between the signal conductive line 303 and the ground plane 305. In addition, the insulating layer 307 may provide a means for configuring the electric field between the signal conductive line 303 and the ground plane 305 by the selection of a material with an appropriate dielectric constant.

The coplanar transmission line 340 may comprise the signal conductive lines 311 and 313 and the insulating layer 307. A signal may be propagated through the coplanar transmission line 340 by applying a signal voltage across the signal conductive lines 311 and 313. The length of the signal conductive lines 311 and 313 may correspond to an integer factor of one fourth of the wavelength of the RF signal to be propagated through the coplanar transmission line 340. The thickness and the dielectric constant of the insulating layer 307 may determine the electric field strength generated by the propagating signal. The characteristic impedance of the coplanar transmission line 340 may be utilized to determine the output power level of a power splitter, such as the power splitter 220 described with respect to FIG. 2A.

The substrate 309 may comprise a semiconductor or insulator material that may provide mechanical support for the microstrip transmission line 320, the coplanar transmission line 340, and other devices that may be integrated. The substrate 309 may comprise the multi-layer package 213, described with respect to FIG. 2C. In another embodiment of the invention, the substrate 309 may comprise Si, GaAs, sapphire, InP, GaO, ZnO, CdTe, CdZnTe and/or $Al_2O_3$, for example, or any other substrate material that may be suitable for integrating microstrip or coplanar waveguide structures.

In operation, an AC signal may be applied across the signal conductive line 303 and the ground plane 305, and/or the signal conductive lines 311 and 313. The microstrip transmission line 320 and/or the coplanar transmission line 340 may propagate an RF signal that was communicated to the power splitter 220, described with respect to FIG. 2A. The wavelength of the received RF signal may correspond to the length of the signal conductive lines 303, 311, and 313. In this manner, the power levels of output signals generated by the power splitter 220 by splitting a received RF signal may be determined by configuring the dimensions of the microstrip transmission line 320 and/or the coplanar transmission line 340

Figure 4:
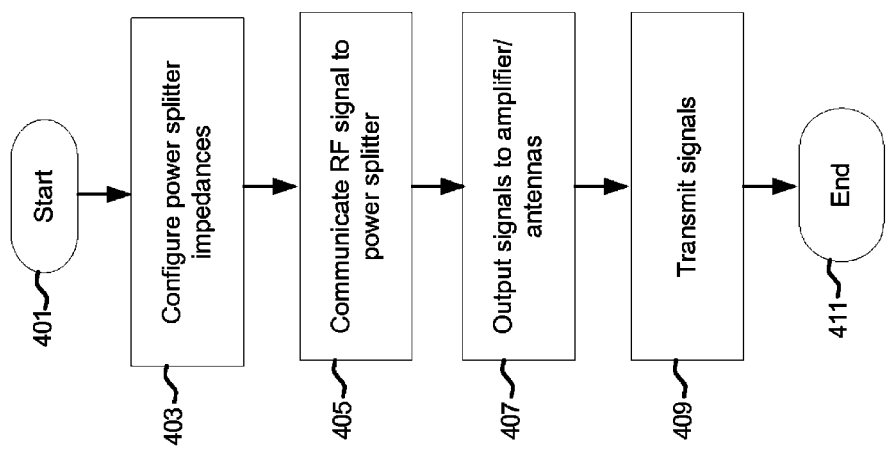
FIG. 4. is a block diagram illustrating exemplary steps for processing signals via power splitters integrated in a multi-layer package, in accordance with an embodiment of the invention.

FIG. 4. is a block diagram illustrating exemplary steps for processing signals via power splitters integrated in a multi-layer package, in accordance with an embodiment of the invention. In step 403, after start step 401, the impedances of the power splitters may be configured to provide various output power levels. In step 405, an RF signal may be communicated to the power splitters followed by step 407, where the output signals may be generated. In step 409, the output RF signal may be transmitted, followed by end step 411.

In an embodiment of the invention, a method and system are disclosed for generating via a power splitter 220, 240, one or more RF signals proportional to one or more received RF signals. The power splitter 220, 240 may be integrated in a multi-layer package 213. The generated RF signals may be processed via one or more circuits within an integrated circuit 201, which may be electrically coupled to the multi-layer package 213. The power splitters 220 may comprise quarter wavelength transmission lines 320, 340 or any integer multiple of quarter wavelength. The transmission lines may comprise a microstrip structure 320 or a coplanar structure 340. The power splitter 220, 240 may be electrically coupled to one or more capacitors in the integrated circuit 201. The capacitors may comprise CMOS devices in the integrated circuit 201. The power splitters 240 may comprise lumped devices 242A, 242B, 242C, 244A, 244B, and 246 which may comprise surface mount devices 215A, 215B, and 215C coupled to the multi-layer package 213. The lumped devices 242A, 242B, 242C, 244A, 244B, and 246 may comprise devices integrated in the integrated circuit 201. The integrated circuit 201 may be flip-chip bonded to the multi-layer package 213.

Certain embodiments of the invention may comprise a machine-readable storage having stored thereon, a computer program having at least one code section for processing signals via power splitters embedded in an integrated circuit package, the at least one code section being executable by a machine for causing the machine to perform one or more of the steps described herein.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for wireless communication, the method comprising:
   generating, utilizing a power splitter, one or more RF signals whose power is proportional to one or more received RF signals, wherein said power splitter is integrated in a multi-layer package; and
   processing said one or more generated RF signals utilizing one or more circuits within an integrated circuit, wherein said integrated circuit is bonded to said multi-layer package.

2. The method according to claim 1, wherein said power splitter comprises quarter wavelength transmission lines or any integer multiple of quarter wavelength.

3. The method according to claim 2, wherein said transmission lines comprise a microstrip structure.

4. The method according to claim 2, wherein said transmission lines comprise a coplanar structure.

5. The method according to claim 1, wherein said power splitter is electrically coupled to one or more capacitors in said integrated circuit.

6. The method according to claim 5, wherein said one or more capacitors comprise CMOS devices in said integrated circuit.

7. The method according to claim 1, wherein said power splitters comprise lumped devices.

8. The method according to claim 7, wherein said lumped devices comprise surface mount devices coupled to said multi-layer package.

9. The method according to claim 7, wherein said lumped devices comprise devices integrated in said integrated circuit.

10. The method according to claim 1, wherein said integrated circuit is flip-chip bonded to said multi-layer package.

11. A system for wireless communication, the system comprising:
    a multilayer package bonded to an integrated circuit, wherein said multi-layer package comprises a power splitter that is operable to generate one or more RF signals whose power is proportional to a received RF signal; and
    one or more circuits within said integrated circuit that is operable to process said one or more generated RF signals.

12. The system according to claim 11, wherein said power splitter comprises quarter wavelength transmission lines or any integer multiple of quarter wavelength.

13. The system according to claim 12, wherein said transmission lines comprise a microstrip structure.

14. The system according to claim 12, wherein said transmission lines comprise a coplanar structure.

15. The system according to claim 11, wherein said power splitter is electrically coupled to one or more capacitors in said integrated circuit.

16. The system according to claim 15, wherein said one or more capacitors comprise CMOS devices in said integrated circuit.

17. The system according to claim 11, wherein said power splitters comprise lumped devices.

18. The system according to claim 17, wherein said lumped devices comprise surface mount devices coupled to said multi-layer package.

19. The system according to claim 17, wherein said lumped devices comprise devices integrated in said integrated circuit.

20. The system according to claim 11, wherein said integrated circuit is flip-chip bonded to said multi-layer package.

* * * * *